US012784628B2

(12) United States Patent
Sun

(10) Patent No.: US 12,784,628 B2
(45) Date of Patent: Nov. 3, 2026

(54) DISPLAY PANEL AND TESTING METHOD THEREOF, AND DISPLAYING DEVICE

(71) Applicant: BOE Technology Group Co., Ltd., Beijing (CN)

(72) Inventor: Yuqian Sun, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 143 days.

(21) Appl. No.: 18/845,599

(22) PCT Filed: May 27, 2024

(86) PCT No.: PCT/CN2024/095597

§ 371 (c)(1),
(2) Date: Sep. 10, 2024

(87) PCT Pub. No.: WO2024/235340

PCT Pub. Date: Nov. 21, 2024

(65) Prior Publication Data

US 2026/0171038 A1 Jun. 18, 2026

(30) Foreign Application Priority Data

May 18, 2023 (WO) ................ PCT/CN2023/095139

(51) Int. Cl.
*G09G 3/20* (2006.01)
*G09G 3/36* (2006.01)
*H10K 59/12* (2023.01)

(52) U.S. Cl.
CPC ............. *G09G 3/2003* (2013.01); *G09G 3/36* (2013.01); *H10K 59/12* (2023.02)

(58) Field of Classification Search
CPC .................. G03G 3/36; G03G 3/2003; G03G 2320/0219; H10K 59/12; H10K 59/1216
See application file for complete search history.

(56) References Cited

U.S. PATENT DOCUMENTS

2021/0018781 A1* 1/2021 Chen .................. G02F 1/13338

FOREIGN PATENT DOCUMENTS

CN 111554238 A 8/2020
CN 115867084 A 3/2023

* cited by examiner

*Primary Examiner* — Christopher E Mahoney
(74) *Attorney, Agent, or Firm* — WHDA, LLP

(57) ABSTRACT

A display panel and a testing method thereof, and a displaying device. The display panel includes: a substrate, and a plurality of sub-pixels located on one side of the substrate. The ratio of the capacitance-variation values of two sub-pixels having different luminescent colors is greater than or equal to a first threshold, and less than or equal to a second threshold, wherein the first threshold is less than or equal to 1, and the second threshold is greater than or equal to 1, wherein the capacitance-variation values are used to characterize the difference between an initial capacitance and a first capacitance of a sub-pixel, the initial capacitance refers to a capacitance of the sub-pixel when the brightness of the display panel is an initial brightness, and the first capacitance refers to a capacitance of the sub-pixel when the brightness of the display panel attenuates to a target brightness.

20 Claims, 3 Drawing Sheets

DISPLAY PANEL AND TESTING METHOD THEREOF, AND DISPLAYING DEVICE

This application claims priority to the International Application No. PCT/CN2023/095139, entitled "DISPLAY PANEL AND TESTING METHOD THEREOF, AND DISPLAYING DEVICE" filed in China National Intellectual Property Administration on May 18, 2023, which is incorporated herein by reference in their entirety.

TECHNICAL FIELD

The embodiments of the present disclosure relate to the technical field of displaying, and particularly relate to a display panel and a testing method thereof, and a displaying device.

BACKGROUND

Organic electroluminescent diodes (OLED, Organic Light Emitting Diode) have the advantages such as full solid state, self-illumination, a high brightness, a high resolution, a wide visual angle, a high response speed, a low thickness, a small volume, a low weight, usability in flexible base plates, low-voltage direct-current driving, a low power consumption and a wide range of operating temperature, which results in a very extensive application market of them. Because of the high quantity of the layer-like structures of the OLED devices, the interface structures have a decisive influence on the device performances (for example, the current density, the luminous brightness, the luminous intensity and the stability).

SUMMARY

The present disclosure employs the following technical solutions:

The first aspect of the present disclosure provides a display panel, wherein the display panel includes:

- a substrate, and a plurality of sub-pixels located on one side of the substrate; and
- a ratio of capacitance-variation values of two sub-pixels having different luminescent colors is greater than or equal to a first threshold, and less than or equal to a second threshold, wherein the first threshold is less than or equal to 1, and the second threshold is greater than or equal to 1, wherein the capacitance-variation values are used to characterize a difference between an initial capacitance and a first capacitance of a sub-pixel, the initial capacitance refers to a capacitance of the sub-pixel when a brightness of the display panel is an initial brightness, and the first capacitance refers to a capacitance of the sub-pixel when the brightness of the display panel attenuates to a target brightness.

In an alternative embodiment, a brightness ratio of the target brightness and the initial brightness is greater than or equal to 50%, and less than or equal to 90%.

In an alternative embodiment, the first threshold is greater than or equal to 0.7, and less than or equal to 1; and the second threshold is greater than or equal to 1, and less than or equal to 1.3.

In an alternative embodiment, each of the sub-pixels includes:

- a first electrode, a luminescent layer and a second electrode that are arranged sequentially in stack on one side of the substrate; and

- a first charge-carrier layer and a second charge-carrier layer, wherein the first charge-carrier layer is provided between the first electrode and the luminescent layer, and the second charge-carrier layer is provided between the second electrode and the luminescent layer.

In an alternative embodiment, when the first electrode is an anode, and the second electrode is a cathode, the first charge-carrier layer includes:

- at least one of a hole injection layer, a hole transporting layer and an electron blocking layer, wherein the hole injection layer, the hole transporting layer and the electron blocking layer are arranged sequentially in stack in a first direction between the anode and the luminescent layer, wherein the first direction refers to a direction from the anode pointing to the cathode; and the second charge-carrier layer includes:

at least one of a hole blocking layer, an electron transporting layer and an electron injection layer, wherein the hole blocking layer, the electron transporting layer and the electron injection layer are arranged sequentially in stack in the first direction between the luminescent layer and the cathode.

In an alternative embodiment, a HOMO energy level of the hole transporting layer is greater than or equal to −5.8 eV, and less than or equal to −5.0 eV.

In an alternative embodiment, a HOMO energy level of the electron blocking layer is greater than or equal to −5.8 eV, and less than or equal to −5.0 eV.

In an alternative embodiment, a LUMO energy level of the hole blocking layer is greater than or equal to −3.5 eV, and less than or equal to −2.5 eV.

In an alternative embodiment, a LUMO energy level of the electron transporting layer is greater than or equal to −3.5 eV, and less than or equal to −2.5 eV.

In an alternative embodiment, a material of the electron injection layer includes any one or more of a low-work-function-metal-type electron injection material and a metal-salt-type electron injection material.

In an alternative embodiment, a material of the hole injection layer includes any one or more of a hole injection material and a P-type doping material, and the hole injection material includes any one or more of copper phthalocyanine, 2,3,6,7,10,11-hexacyano-1,4,5,8,9,12-hexaazabenzophenanthrene and $MnO_3$.

In an alternative embodiment, the sub-pixels include at least a red sub-pixel, a green sub-pixel and a blue sub-pixel, a material of a luminescent layer of the red sub-pixel includes a red luminescent material, a material of a luminescent layer of the green sub-pixel includes a green luminescent material, and a material of a luminescent layer of the blue sub-pixel includes a blue luminescent material;

- the red luminescent material includes any one or more of a DCM-series-type red luminescent material and a metal-complex-type red luminescent material;
- the blue luminescent material includes any one or more of a pyrene-derivative-type blue luminescent material, an anthracene-derivative-type blue luminescent material, a fluorene-derivative-type blue luminescent material, a perylene-derivative-type blue luminescent material, a styrylamine-derivative-type blue luminescent material and a metal-complex-type blue luminescent material; and the green luminescent material includes any one or more of a coumarin-dye-type green luminescent material, a quinacridine-copper-derivative-type green luminescent material, a polycyclic-aromatic-hydrocarbon-type green luminescent material, a diaminoanthracene-type-derivative-type green luminescent material, a carbazole-derivative-type green luminescent material and a metal-complex-type green luminescent material.

In an alternative embodiment, the red luminescent material includes any one or more of 4-(dicyanomethylene)-2-methyl-6-(4-dimethylaminostyryl)-4H-pyran, 4-(dicyanomethylene)-2-tert-butyl-6-(1,1,7,7-tetramethyljulolidin-9-alkenyl)-4H-pyran, di(1-phenylisoquinoline)(acetylacetone) iridium(III), octaethyl porphyrin platinum and di(2-(2'-benzothiophenyl)pyridine-N,C3')(acetylacetone)iridium.

In an alternative embodiment, the green luminescent material includes any one or more of coumarin 6, coumarin 545 T, quinacridine copper, N,N'-dimethylquinacridone, 5,12-diphenylnaphthonaphthalene, N10,N10'-diphenyl-N10,N10'-dibenzoyl-9,9'-dianthracene-10,10'-diamine, tri (8-hydroxyquinoline)aluminum(III), tri(2-phenylpyridine) iridium and acetopyruvic acid di(2-phenylpyridine)iridium.

In an alternative embodiment, the blue luminescent material includes any one or more of N1,N6-di([1,1'-biphenyl]-2-yl)-N1,N6-di([1,1'-biphenyl]-4-yl)pyrene-1,6-diamine, 9,10-di-(2-naphthyl)anthracene, 2-methyl-9,10-di-2-naphthylanthracene, 4,4'-di[4-(diphenylamino)styryl]biphenyl, 2,5,8,11-tetra-tert-butylperylene, 4,4'-di[4-(di-p-methylphenylamido)styryl]biphenyl and di(4,6-difluorophenylpyridine-C2,N)pyridine formyl iridium.

On the basis of the same inventive concept, the second aspect of the present disclosure provides a displaying device, wherein the displaying device includes the display panel according to any one of the embodiments in the first aspect;

- a driving circuit for supplying a driving signal to the display panel; and
- a power supply circuit for supplying a power signal to the display panel.

On the basis of the same inventive concept, the third aspect of the present disclosure provides a testing method of a display panel, wherein the display panel includes a substrate, and a plurality of sub-pixels located on one side of the substrate, and the testing method includes:

- in a state in which a brightness of the display panel is an initial brightness, acquiring an initial capacitance of a sub-pixel;
- in a state in which the brightness of the display panel is a target brightness, acquiring a first capacitance of the sub-pixel;
- comparing the initial capacitance and the first capacitance of the sub-pixel, to obtain a capacitance-variation value of the sub-pixel;
- calculating a ratio of the capacitance-variation values of two sub-pixels having different colors; and
- if the ratio is greater than or equal to a first threshold, and less than or equal to a second threshold, determining that the display panel is tested to be qualified.

In an alternative embodiment, the plurality of sub-pixels include a first-color sub-pixel, and the step of, in the state in which the brightness of the display panel is the initial brightness, acquiring the initial capacitance of the sub-pixel includes:

- in the state in which the brightness of the display panel is the initial brightness, controlling the first-color sub-pixel of the display panel to emit light;
- testing a capacitance-voltage relation of the first-color sub-pixel; and
- according to the capacitance-voltage relation of the first-color sub-pixel, obtaining the initial capacitance of the first-color sub-pixel.

In an alternative embodiment, the plurality of sub-pixels include a second-color sub-pixel, and the step of, in the state in which the brightness of the display panel is the target brightness, acquiring the first capacitance of the sub-pixel includes:

- in the state in which the brightness of the display panel is the target brightness, controlling the second-color sub-pixel of the display panel to emit light;
- testing a capacitance-voltage relation of the second-color sub-pixel; and
- according to the capacitance-voltage relation of the second-color sub-pixel, obtaining the first capacitance of the second-color sub-pixel.

In an alternative embodiment, the step of comparing the initial capacitance and the first capacitance of the sub-pixel, to obtain the capacitance-variation value of the sub-pixel includes:

- calculating a ratio of the initial capacitance to the first capacitance of the sub-pixel, to obtain the capacitance-variation value of the sub-pixel.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work.

Figure 1:
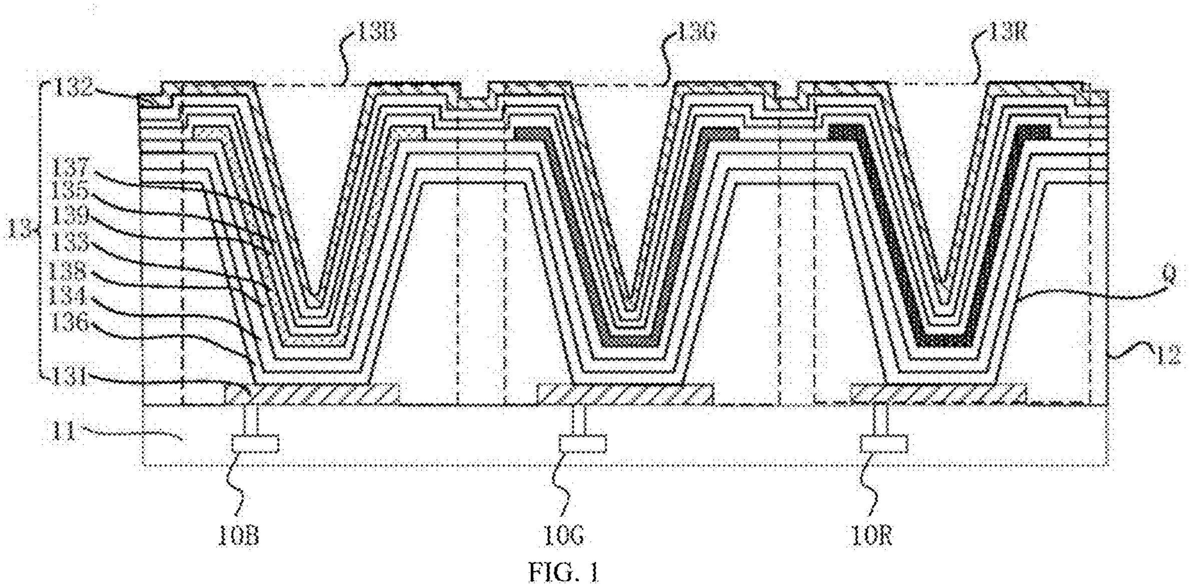
FIG. 1 schematically shows a schematic structural diagram of a display panel according to the present disclosure.

Reference numbers: 11: substrate; 12: pixel defining layer; 13: sub-pixels; 13R: red sub-pixel; 13G: green sub-pixel; 13B: blue sub-pixel; 131: first electrode; 132: second electrode; 133: luminescent layer; 134: hole transporting layer; 135: electron transporting layer; 136: hole injection layer; 137: electron injection layer; 138: electron blocking layer; 139: hole blocking layer; 10R: red driving circuit; 10G: green driving circuit; 10B: blue driving circuit; and Q: opening.

DETAILED DESCRIPTION

In order to make the objects, the technical solutions and the advantages of the embodiments of the present disclosure clearer, the technical solutions according to the embodiments of the present disclosure will be clearly and completely described below with reference to the drawings according to the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Display screens continuously develop with the trend of a high pixel definition, a large color gamut and a low power consumption. OLED (organic electroluminescent diodes, Organic Light Emitting Diode) flexible display screens have obvious advantages over TFT-LCD, for example, the advantages of foldability and bendability, which makes flexible screens become the future of the development of display screens, and very popular in electronic-device fans. Therefore, there are increasingly higher requirements on the device efficiency and the life of the OLED devices in the industry. Although many OLED devices having a high efficiency and a long life that can satisfy the usage have already been developed currently, in practical usage, they cannot completely satisfy the effect of displaying that currently the industry is pursuing. Besides color saturation and brightness, the accuracy of color displaying has become the focus of attention currently.

An OLED device has many layer-like structures. The differences in the physical and chemical properties of the materials of the layers that form the OLED device decide that the OLED device itself has several to tens of two-dimensional interfaces of the atom thickness, for example, the anode/organic-layer interfaces, the organic-layer/organic-layer interfaces, the organic-layer/cathode interfaces and the intra-layer interfaces, which interface structures are important components of the device structure. Because the various types of interfaces in the device directly influence the movements inside the device such as the injection, the transportation and the diffusion of the charge carriers and the formation, the diffusion and the quenching of the excitons, the interface structures in the OLED device have a decisive influence on the device performances (for example, the current density, the luminous brightness, the luminous intensity and the stability).

However, those many layer-like structures result in the existence of the interface barrier potential and so on, and especially, the charge accumulation at the interfaces in operation is inevitable, which results in variation of the performances of the device. Color display panels are realized by using a plurality of sub-pixels having different luminescent colors (for example, RGB sub-pixels) together. Because electric fields exist inside the OLED, or the interface charge accumulation in operation causes variation of the electric fields, the balance between the sub-pixels having different luminescent colors is broken; in other words, the levels of the variations of the efficiencies or the operation voltages of the sub-pixels having different luminescent colors are different. That results in problems in the accuracy of the color displaying such as chromatic aberration, which seriously affects the usage experience of the consumers.

In view of the above, the present disclosure provides a display panel. FIG. 1 schematically shows a schematic structural diagram of a display panel according to the present disclosure. As shown in FIG. 1, the display panel includes:

a substrate 11, and a plurality of sub-pixels 13 (taking the RGB sub-pixels in FIG. 1 as an example, they include a blue sub-pixel 13B, a green sub-pixel 13G and a red sub-pixel 13R). The sub-pixels are located on one side of the substrate 11. The plurality of sub-pixels 13 may be all or some of the sub-pixels included by the displaying base plate.

In an embodiment of the present disclosure, the display panel may be a display panel emitting white light, and may also be a display panel emitting color light (a light whose color is regulatable). The display panel realizes emitting the white light or emitting the color light by controlling the luminous brightness of a plurality of sub-pixels having different luminescent colors. Taking the RGB sub-pixels in FIG. 1 as an example, by controlling the blue sub-pixel 13B, the red sub-pixel 13R and the green sub-pixel 13G to simultaneously emit light, it can be realized that the display panel displays the mixed light of the blue sub-pixel 13B, the red sub-pixel 13R and the green sub-pixel 13G, to cause the light emitting base plate 1 to present a white light. By controlling the luminous brightness of the blue sub-pixel 13B, the red sub-pixel 13R and the green sub-pixel 13G, the color and the brightness of the mixed light emitted by the display panel can be controlled, thereby realizing color light emission.

In an embodiment of the present disclosure, the ratio of the capacitance-variation values of two sub-pixels having different luminescent colors is greater than or equal to a first threshold, and less than or equal to a second threshold, wherein the first threshold is less than or equal to 1, and the second threshold is greater than or equal to 1, wherein the capacitance-variation values are used to characterize the difference between an initial capacitance and a first capacitance of a sub-pixel, the initial capacitance refers to the capacitance of the sub-pixel when the brightness of the display panel is an initial brightness, and the first capacitance refers to the capacitance of the sub-pixel when the brightness of the display panel attenuates to a target brightness. The initial capacitance may refer to the capacitance of the sub-pixel under a target voltage when the brightness of the display panel is the initial brightness, and the first capacitance may refer to the capacitance of the sub-pixel under the target voltage when the brightness of the display panel attenuates to the target brightness. Preferably, the initial capacitance refers to the maximum capacitance of the sub-pixel under various voltages when the brightness of the display panel is the initial brightness, and the first capacitance refers to the maximum capacitance of the sub-pixel under various voltages when the brightness of the display panel attenuates to the target brightness.

In an embodiment of the present disclosure, when the brightness of the display panel is the initial brightness or the target brightness, in the process during which the sub-pixels of the display panel are applied the target voltage, the holes generated by the anodes and the electrons generated by the cathodes pass through the organic layers of the sub-pixels and move to the luminescent layers of the sub-pixels, and, under the target voltage, the holes and the electrons are concentrated at the interfaces between different layer components, wherein the layer component interface where the electrons are distributed and the layer component interface where the holes are distributed form a plurality of capacitors that are connected in parallel, and the plurality of capacitors under the target voltage are combined into the initial capacitance.

The initial capacitance may refer to the capacitance of a single sub-pixel when the brightness of the display panel is the initial brightness, and may also refer to the capacitance of the display panel (all of the sub-pixels that emit light) when the brightness of the display panel is the initial brightness. The first capacitance may refer to the capacitance of a single sub-pixel when the brightness of the display panel is the target brightness, and may also refer to the capacitance of the display panel (all of the sub-pixels that emit light) when the brightness of the display panel is the target brightness.

The capacitance-variation value of the sub-pixel is used to characterize the difference between the initial capacitance and the first capacitance, whereby the capacitance state of the sub-pixel after the brightness attenuation in the display panel is measured based on a pixel variation value. The capacitance-variation value may refer to the difference between the initial capacitance and the first capacitance of the sub-pixel, and may also refer to the ratio of the initial capacitance to the first capacitance of the sub-pixel. The particular capacitance-variation value may be decided according to practical situations, and is not limited in the present disclosure.

The initial brightness refers to the brightness of the displaying device in the initial state, and the initial state refers to the light-emission state of the displaying device when the brightness of the display panel does not attenuate. The target brightness refers to the brightness of the displaying device after it is attenuated from the initial brightness. In an alternative embodiment, the brightness ratio of the target brightness and the initial brightness is greater than or equal to 50%, and less than or equal to 90%. As an example, the target brightness is 90% of the initial brightness, which indicates that the target brightness is the brightness when the brightness of the display panel of the displaying device in the initial state attenuates to 90% of the initial brightness. It should be noted that the above example is merely an alternative solution provided to enable a person skilled in the art to comprehend the present disclosure better, and the particular brightness ratio of the target brightness to the initial brightness may be decided according to practical situations, and is not limited in the present disclosure.

In an alternative embodiment, the first threshold is greater than or equal to 0.7, and less than or equal to 1, and the second threshold is greater than or equal to 1, and less than or equal to 1.3. The ratio of the capacitance-variation values of two sub-pixels having different luminescent colors of the display panel according to the present disclosure is greater than or equal to a first threshold, and less than or equal to the second threshold. Preferably, the first threshold is 0.8, the second threshold is 1.25, and the ratio of the capacitance-variation values of two sub-pixels having different luminescent colors of the display panel according to the present disclosure is greater than or equal to 0.8, and less than or equal to 1.25.

By using the display panel according to the present disclosure, the ratio of the capacitance-variation values of its two sub-pixels having different luminescent colors is between the first threshold and the second threshold. That indicates that, in the displaying device employing the display panel according to the present disclosure, the effect of color displaying maintains substantially unchanged in the initial state and during usage. That indicates that the capacitance-variation values of the sub-pixels having different luminescent colors of the display panel according to the present disclosure are in a relative equilibrium state; in other words, the levels of the variations of the efficiencies or the operation voltages of the sub-pixels having different luminescent colors are substantially the same, and problems in the accuracy of the color displaying such as chromatic aberration do not happen, which highly improves the usage experience of the user. However, in a displaying device not employing the display panel according to the present disclosure, the ratio of the capacitance-variation values of its two sub-pixels having different luminescent colors is not in the range from the first threshold to the second threshold. The capacitance balance between its sub-pixels having different luminescent colors is broken, and the levels of the variations of the efficiencies or the operation voltages of the sub-pixels having different luminescent colors are different, which results in imperfects such as chromatic aberration, thereby seriously affecting the usage experience of the user.

The difference in the capacitance-variation value in the display panel according to the present disclosure depends on the layer components of the different sub-pixels. By adjusting the materials of the various layers of the sub-pixels, the ratio of the capacitance-variation values of two sub-pixels having different luminescent colors of the display panel is made in the range from the first threshold to the second threshold, thereby preventing the problem of inaccuracy in the color displaying of the display panel. The layer components of the sub-pixels will be described in detail below.

In an alternative embodiment, as shown in FIG. 1, each of the sub-pixels 13 includes a first electrode 131, a second electrode 132 and a luminescent layer 133, wherein the first electrode 131, the luminescent layer 133 and the second electrode 132 are arranged sequentially in stack on one side of the substrate 11; a first charge-carrier layer, wherein the first charge-carrier layer is provided between the first electrode 131 and the luminescent layer 133; and a second charge-carrier layer, wherein the second charge-carrier layer is provided between the second electrode 132 and the luminescent layer 133. It should be noted that one of the first electrode and the second electrode is the anode, and the other is the cathode. If the first electrode is the anode, the second electrode is the cathode, which corresponds to that the display panel is the display panel of a top-emission displaying device. If the first electrode is the cathode, the second electrode is the anode, which corresponds to that the display panel is the display panel of a bottom-emission displaying device. The first electrode and the second electrode may be decided particularly according to practical situations, and are not limited in the present disclosure.

The layer components that the first charge-carrier layer and the second charge-carrier layer may include will be described below by taking the display panel of a top-emission displaying device as an example. As shown in FIG. 1, if the first electrode 131 is an anode and the second electrode 132 is a cathode, the first charge-carrier layer includes at least one of a hole injection layer (HIL) 136, a hole transporting layer (HTL) 134 and an electron blocking layer (EBL) 138, wherein the hole injection layer 136, the hole transporting layer 134 and the electron blocking layer 138 are arranged sequentially in stack in a first direction between the first electrode 131 (anode) and the luminescent layer 133, wherein the first direction refers to the direction from the first electrode 131 (anode) pointing to the second electrode 132 (cathode). The electron blocking layer 138 serves to block the diffusion of the electrons that are transmitted by the luminescent layer 133, to constraint the electrons and the holes within the luminescent layer, and at the same time reduce the injection barrier potential and also reduce the interface charge accumulation, to delay the interface deterioration, which can prolong the life of the sub-pixel. It should be noted that the first charge-carrier layer may include merely any one of the hole injection layer 136, the hole transporting layer 134 and the electron blocking layer 138, may also include any two of the hole injection layer 136, the hole transporting layer 134 and the electron blocking layer 138, and may also include all of the hole injection layer 136, the hole transporting layer 134 and the electron blocking layer 138. The first charge-carrier layer may be configured particularly according to practical situations, which is not limited in the present disclosure.

Preferably, the first charge-carrier layer includes the hole injection layer 136, wherein the hole injection layer 136 is provided on the side of the first electrode 131 that is opposite to the substrate 11; the hole transporting layer 134, wherein the hole transporting layer 134 is provided on the side of the hole injection layer 136 that is opposite to the substrate 11; and the electron blocking layer 138, wherein the electron blocking layer 138 is provided on the side of the hole transporting layer 134 that is opposite to the substrate 11.

As shown in FIG. 1, if the first electrode 131 is an anode and the second electrode 132 is a cathode, the second charge-carrier layer includes at least one of a hole blocking layer (HBL) 139, an electron transporting layer (ETL) 135 and an electron injection layer (EIL) 137, wherein the hole blocking layer 139, the electron transporting layer 135 and the electron injection layer 137 are arranged sequentially in stack in the first direction between the luminescent layer 133 and the second electrode 132 (cathode). The hole blocking layer 139 can serve to block the diffusion of the holes that are transmitted by the luminescent layer 133, to constraint the holes within the luminescent layer, and at the same time reduce the injection barrier potential and reduce the interface charge accumulation, to delay the interface deterioration, which can prolong the life of the sub-pixel. It should be noted that the second charge-carrier layer may include merely any one of the hole blocking layer 139, the electron transporting layer 135 and the electron injection layer 137, may also include any two of the hole blocking layer 139, the electron transporting layer 135 and the electron injection layer 137, and may also include all of the hole blocking layer 139, the electron transporting layer 135 and the electron injection layer 137. The second charge-carrier layer may be configured particularly according to practical situations, which is not limited in the present disclosure.

Preferably, the second charge-carrier layer includes the hole blocking layer 139, wherein the hole blocking layer 139 is provided on the side of the luminescent layer 133 that is opposite to the substrate 11; the electron transporting layer 135, wherein the electron transporting layer 135 is provided on the side of the hole blocking layer 139 that is opposite to the substrate 11; and the electron injection layer 137, wherein the electron injection layer 137 is provided on the side of the electron transporting layer 135 that is opposite to the substrate 11.

In an alternative embodiment, the anode may be a material having a high work function. As an example, the anode may be any one or more of ITO (Indium Tin Oxides), IZO (Indium Zinc Oxide) and a composite material (for example, Ag/ITO, Al/ITO, Ag/IZO and Al/IZO, wherein Ag/ITO is of a tandem structure obtained by stacking a metal silver electrode and an ITO electrode).

In an alternative embodiment, the cathode may be a material having a low work function. As an example, the cathode may be any one or more of Al, Ag, Mg, and a low-work-function metal alloy material (for example, a magnesium-aluminum alloy and a magnesium-silver alloy).

In an alternative embodiment, the HOMO energy level of the hole transporting layer is greater than or equal to −5.8 eV, and less than or equal to −5.0 eV. By using a hole transporting material in that range of the HOMO energy level as the sub-pixels of the hole transporting layer, it is easier to enable the display panel to satisfy that the ratio of the capacitance-variation values of two sub-pixels having different luminescent colors is between the first threshold and the second threshold. Therefore, the hole transporting layer is preferably selected from the materials in that energy-level range. As an example, the hole transporting layer may be a P-type doping material containing an arylamine.

In an alternative embodiment, the HOMO energy level of the electron blocking layer is greater than or equal to −5.8 eV, and less than or equal to −5.0 eV. By using an electron blocking material in that range of the HOMO energy level as the sub-pixels of the electron blocking layer, it is easier to enable the display panel to satisfy that the ratio of the capacitance-variation values of two sub-pixels having different luminescent colors is between the first threshold and the second threshold. Therefore, the electron blocking layer is preferably selected from the materials in that energy-level range. As an example, the electron blocking layer may be a P-type doping material containing an arylamine. The HOMO energy level of the electron blocking layer is preferably greater than or equal to −5.2 eV, and less than or equal to −5.4 eV, to enable the display panel to satisfy that the ratio of the capacitance-variation values of two sub-pixels having different luminescent colors is easier to be between the first threshold and the second threshold.

In an alternative embodiment, the LUMO energy level of the hole blocking layer is greater than or equal to −3.5 eV, and less than or equal to −2.5 eV. By using a hole blocking material in that range of the LUMO energy level as the sub-pixels of the hole blocking layer, it is easier to enable the display panel to satisfy that the ratio of the capacitance-variation values of two sub-pixels having different luminescent colors is between the first threshold and the second threshold. Therefore, the hole blocking layer is preferably selected from the materials in that energy-level range, and the thickness of the hole blocking layer is 10 nm to 70 nm. As an example, the hole blocking layer may be an organic material doped by LiQ (whose structural formula is as follows), Li, Ca and so on.

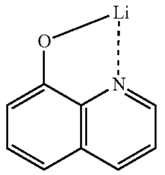

LiQ

In an alternative embodiment, the LUMO energy level of the electron transporting layer is greater than or equal to −3.5 eV, and less than or equal to −2.5 eV. By using an electron transporting material in that range of the LUMO energy level as the sub-pixels of the electron transporting layer, it is easier to enable the display panel to satisfy that the ratio of the capacitance-variation values of two sub-pixels having different luminescent colors is between the first threshold and the second threshold. Therefore, the electron transporting layer is preferably selected from the materials in that energy-level range, and the thickness of the electron transporting layer is 10 nm to 70 nm. As an example, the electron transporting layer may be an organic material doped by LiQ, Li, Ca and so on.

In an alternative embodiment, the material of the electron injection layer includes any one or more of a low-work-function-metal-type electron injection material and a metal-salt-type electron injection material. Furthermore, the thickness of the electron injection layer is 0.5 nm to 2 nm. By using an electron injection material selected from those types as the sub-pixels of the electron injection layer, it is easier to enable the display panel to satisfy that the ratio of the capacitance-variation values of two sub-pixels having different luminescent colors is between the first threshold and the second threshold. As an example, the electron injection material may be a low-work-function-metal-type electron injection material such as Li, Ca and Yb, or a metal-salt-type electron injection material such as the metal salts LiF and LiQ (whose structural formula is described above).

In an alternative embodiment, the material of the hole injection layer includes any one or more of a hole injection material and a P-type doping material, and the hole injection material includes any one or more of copper phthalocyanine, 2,3,6,7,10,11-hexacyano-1,4,5,8,9,12-hexaazabenzo-phenanthrene and $MnO_3$. Furthermore, the material thickness of the hole injection layer is 5 nm to 30 nm. The P-type doping material refers to a material obtained by performing P-type doping to a hole transporting material. By using a material of the hole injection layer selected from those types as the sub-pixels of the hole injection layer, it is easier to enable the display panel to satisfy that the ratio of the capacitance-variation values of two sub-pixels having different luminescent colors is between the first threshold and the second threshold.

In an alternative embodiment, the sub-pixels include at least a red sub-pixel, a green sub-pixel and a blue sub-pixel, the material of the luminescent layer of the red sub-pixel includes a red luminescent material, the material of the luminescent layer of the green sub-pixel includes a green luminescent material, and the material of the luminescent layer of the blue sub-pixel includes a blue luminescent material.

The red luminescent material includes any one or more of a DCM-series-type red luminescent material and a metal-complex-type red luminescent material. By using a red luminescent material selected from those types as the red sub-pixels of the luminescent layer, it is easier to enable the display panel to satisfy that the ratio of the capacitance-variation values of two sub-pixels having different luminescent colors is between the first threshold and the second threshold. As an example, the red luminescent material includes any one or more of 4-(dicyanomethylene)-2-methyl-6-(4-dimethylaminostyryl)-4H-pyran, 4-(dicyanomethylene)-2-tert-butyl-6-(1,1,7,7-tetramethyljulolidin-9-alkenyl)-4H-pyran, di(1-phenylisoquinoline)(acetylacetone) iridium(III), octaethyl porphyrin platinum and di(2-(2'-benzothiophenyl)pyridine-N,C3')(acetylacetone)iridium.

The blue luminescent material includes any one or more of a pyrene-derivative-type blue luminescent material, an anthracene-derivative-type blue luminescent material, a fluorene-derivative-type blue luminescent material, a perylene-derivative-type blue luminescent material, a styrylamine-derivative-type blue luminescent material and a metal-complex-type blue luminescent material. By using a blue luminescent material selected from those types as the blue sub-pixels of the luminescent layer, it is easier to enable the display panel to satisfy that the ratio of the capacitance-variation values of two sub-pixels having different luminescent colors is between the first threshold and the second threshold. As an example, the blue luminescent material includes any one or more of N1,N6-di([1,1'-biphenyl]-2-yl)-N1,N6-di([1,1'-biphenyl]-4-yl)pyrene-1,6-diamine, 9,10-di-(2-naphthyl)anthracene, 2-methyl-9,10-di-2-naphthylanthracene, 2,5,8,11-tetra-tert-butylperylene, 4,4'-di[4-(diphenylamino)styryl]biphenyl, 4,4'-di[4-(di-p-methylphenylamido)styryl]biphenyl and di(4,6-difluorophenylpyridine-C2,N)pyridine formyl iridium.

The green luminescent material includes any one or more of a coumarin-dye-type green luminescent material, a quinacridine-copper-derivative-type green luminescent material, a polycyclic-aromatic-hydrocarbon-type green luminescent material, a diaminoanthracene-type-derivative-type green luminescent material, a carbazole-derivative-type green luminescent material and a metal-complex-type green luminescent material. By using a green luminescent material selected from those types as the green sub-pixels of the luminescent layer, it is easier to enable the display panel to satisfy that the ratio of the capacitance-variation values of two sub-pixels having different luminescent colors is between the first threshold and the second threshold. As an example, the green luminescent material includes any one or more of coumarin 6, coumarin 545 T, quinacridine copper, N,N'-dimethylquinacridone, 5,12-diphenylnaphthonaphthalene, N10,N10'-diphenyl-N10,N10'-dibenzoyl-9,9'-dianthracene-10,10'-diamine, tri(8-hydroxyquinoline)aluminum (III), tri(2-phenylpyridine)iridium and acetopyruvic acid di(2-phenylpyridine)iridium.

In the embodiments of the present disclosure, the layer-component materials of the sub-pixels of each of the luminescent colors are decided according to the above-described ranges of the layer-component materials, and those layer components form the plurality of sub-pixels having different luminescent colors, wherein the ratio of the capacitance-variation values of any two sub-pixels having different luminescent colors is greater than or equal to the first threshold, and less than or equal to the second threshold, which ensures that the capacitance-variation values of the sub-pixels having different luminescent colors of the display panel formed by those sub-pixels are in a relative equilibrium state, whereby the display panel does not have problems in the accuracy of the color displaying such as chromatic aberration, thereby improving the usage experience of the user.

In an alternative embodiment, as shown in FIG. 1, the display panel further includes a pixel defining layer 12, the pixel defining layer 12 has a plurality of openings Q, the plurality of sub-pixels 13 are provided in the pixel defining layer 12 and correspond to the plurality of openings Q, and the plurality of openings Q may be all or some of the openings in the pixel defining layer 12.

The present disclosure provides a displaying base plate, wherein the displaying base plate includes: a substrate, and a plurality of sub-pixels located on one side of the substrate. The ratio of the capacitance-variation values of two sub-pixels having different luminescent colors is greater than or equal to a first threshold, and less than or equal to a second threshold, wherein the first threshold is less than or equal to 1, and the second threshold is greater than or equal to 1, wherein the capacitance-variation values are used to characterize the difference between an initial capacitance and a first capacitance of a sub-pixel, the initial capacitance refers to the capacitance of the sub-pixel when the brightness of the display panel is an initial brightness, and the first capacitance refers to the capacitance of the sub-pixel when the brightness of the display panel attenuates to a target brightness.

In the present disclosure, by adjusting the material compositions of the different layer components of the sub-pixels, to provide the different sub-pixels to satisfy that the ratio of the capacitance-variation values of two sub-pixels having different luminescent colors is greater than or equal to a first threshold and less than or equal to the second threshold, the differences in the capacitance variation of the different sub-pixels tend to be the same, thereby preventing the problem of inaccuracy in the color displaying of the display panel.

On the basis of the same inventive concept, the present disclosure provides a displaying device, wherein the displaying device includes the display panel according to the embodiments of the present disclosure. The display panel further includes a driving circuit (taking FIG. 1 as an example, the driving circuit includes a driving circuit corresponding to the RGB sub-pixels, a red driving circuit 10R, a green driving circuit 10G and a blue driving circuit 10B) and a power supply circuit. The driving circuit is for supplying a driving signal to the display panel. The power supply circuit is for supplying a power signal to the display panel.

In an embodiment of the present disclosure, the displaying device may be a display or a product including a display. The display may be a Flat Panel Display (FPD), a micro-display and so on. If classified based on whether the user can see the scene at the back face of the display, the display may be a transparent display or a non-transparent display. It should be noted that the particular displaying device may be decided according to practical situations, and is not limited in the present disclosure.

Figure 6:
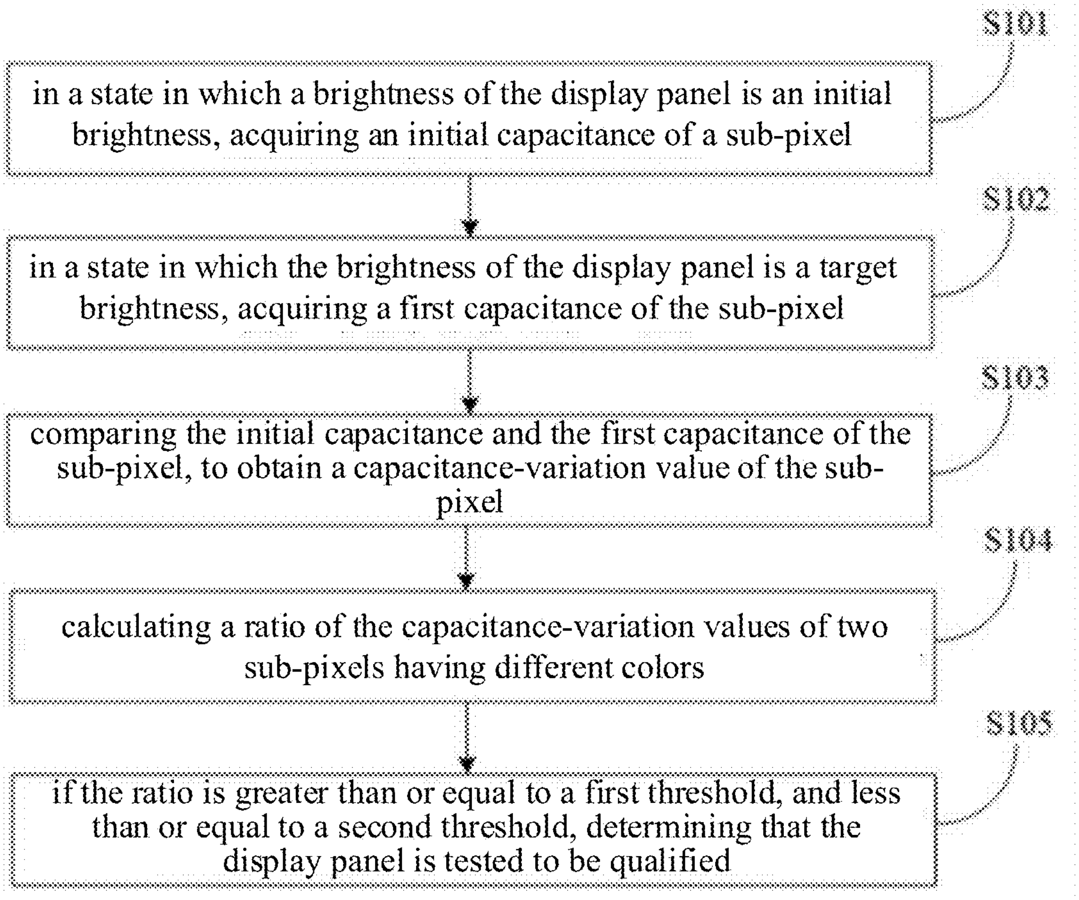
FIG. 6 schematically shows a flow chart of a testing method of a display panel according to the present disclosure.

On the basis of the same inventive concept, an embodiment of the present disclosure provides a testing method of a display panel. On the basis of the testing method of a display panel, the display panel according to the embodiments of the present disclosure is decided. The display panel includes a substrate, and a plurality of sub-pixels located on one side of the substrate, FIG. 6 schematically shows a flow chart of a testing method of a display panel according to the present disclosure. As shown in FIG. 6, the testing method includes the following steps:

S101: in a state in which a brightness of the display panel is an initial brightness, acquiring an initial capacitance of a sub-pixel.

The plurality of sub-pixels include a first-color sub-pixel, and the first-color sub-pixel is any one of the red sub-pixel, the blue sub-pixel and the green sub-pixel. The particular execution of the step S101 includes, firstly, adjusting the display panel to the initial state (the initial state refers to the light-emission state of the displaying device when the brightness of the display panel does not attenuate, at which point the brightness is the initial brightness); in the state in which the brightness of the display panel is the initial brightness, controlling the first-color sub-pixel of the display panel to emit light. And subsequently, testing the capacitance-voltage relation of the first-color sub-pixel in the state in which the brightness of the display panel is the initial brightness, and according to the capacitance-voltage relation of the first-color sub-pixel, obtaining the initial capacitance of the first-color sub-pixel. The capacitance-voltage relation of the first-color sub-pixel may refer to a capacitance-voltage curve of the first-color sub-pixel, which is used to characterize a diagram of a curve of the capacitance-value variation of the first-color sub-pixel in the state of the initial brightness under different voltages. The initial capacitance may refer to the capacitance of a single first-color sub-pixel under a target voltage when the brightness of the display panel is the initial brightness, and may also refer to the capacitance of all of the first-color sub-pixels of the display panel under a target voltage when the brightness of the display panel is the initial brightness. Preferably, the initial capacitance refers to the maximum capacitance of all of the first-color sub-pixels of the display panel under various voltages when the brightness of the display panel is the initial brightness.

In an embodiment of the present application, when the brightness of the display panel is the initial brightness, in the process during which the first-color sub-pixel of the display panel is applied the target voltage, the holes generated by the anode pass through the first charge-carrier layer and move toward the luminescent layer of the first-color sub-pixel, during which process the holes might be distributed at the interfaces of one or more of the layer components of the first charge-carrier layer; and the electrons generated by the cathode pass through the second charge-carrier layer and move toward the luminescent layer of the first-color sub-pixel, during which process the electrons might be distributed at the interfaces of one or more of the layer components of the second charge-carrier layer. Therefore, when the target voltage is reached, the holes and the electrons are concentrated at the interfaces between different layer components, wherein the layer interface where the electrons are distributed and the layer interface where the holes are distributed form a plurality of capacitors that are connected in parallel, and the plurality of capacitors under the target voltage are combined into the initial capacitance of the first-color sub-pixel. Furthermore, based on the initial capacitances under different target voltages, the capacitance-voltage curve of the first-color sub-pixel in the state of the initial brightness is acquired.

As an example, taking the display panel shown in FIG. 1 as an example, when the target voltage is in the range of −1V to 0V, the holes and the electrons do not start to move toward the luminescent layer, the holes are concentratively distributed at the anode 131, and the electrons are concentratively distributed at the cathode 132, at which point the initial capacitance is the capacitance between the cathode 132 and the anode 131. When the target voltage is in the range of 0V to 1V, the electrons do not start to move toward the luminescent layer, and the holes move toward the luminescent layer via the hole injection layer 136, the hole transporting layer 134 and the electron blocking layer 138. When the target voltage is 1V, the holes are concentratively distributed at the interface between the hole transporting layer 134 and the electron blocking layer 138 (referred to for short as a hole interface), at which point the capacitor between the hole interface and the cathode 132 and the capacitor between the cathode 132 and the anode 131 are connected in parallel, and the sum of the two parallel-connected capacitance values is used as the initial capacitance of the first-color sub-pixel under the target voltage of 1V. When the target voltage is in the range of 1V to 1.5V, the electrons also start to move toward the luminescent layer. When the target voltage is 1.5V, the electrons are concentratively distributed at the interface between the electron injection layer 137 and the electron transporting layer 135 (referred to for short as an electron interface), and the holes are concentratively distributed at the interface between the hole transporting layer 134 and the electron blocking layer 138 (referred to for short as a hole interface), at which point all of the capacitor between the electron interface and the anode 131, the capacitor between the hole interface and the cathode 132, the capacitor between the anode 131 and the cathode 132 and the capacitor between the electron interface and the hole interface are connected in parallel, and the sum of the parallel-connected capacitance values is used as the initial capacitance of the first-color sub-pixel at the initial brightness under the target voltage of 1.5V.

It should be noted that the above example is merely a particular situation provided to enable a person skilled in the art to comprehend the process of the capacitor formation according to the present disclosure better, and the positions of the electron interface and the hole interface are decided according to practical situations, and are not limited to those in the above example. For example, under the target voltage, if the display panel is the display panel shown in FIG. 1, the hole interface may be one or more of the interface between the hole transporting layer 134 and the electron blocking layer 138, the interface between the hole injection layer 136 and the hole transporting layer 134, the interface between the anode 131 and the hole injection layer 136, the interface between the electron blocking layer 138 and the luminescent layer 133 and the interface between the luminescent layer 133 and the hole blocking layer 139; the electron interface may be one or more of the interface between the cathode 132 and the electron injection layer 137, the interface between the electron injection layer 137 and the electron transporting layer 135, the interface between the electron transporting layer 135 and the hole blocking layer 139, the interface between the hole blocking layer 139 and the luminescent layer 133 and the interface between the luminescent layer 133 and the electron blocking layer 138, and the sum of the capacitances of all of the parallel-connected capacitors formed between the electron interface and the hole interface is used as the initial capacitance of the first-color sub-pixel at the initial brightness.

S102: in a state in which the brightness of the display panel is a target brightness, acquiring a first capacitance of the sub-pixel.

The plurality of sub-pixels include a second-color sub-pixel, and the second-color sub-pixel is any one of the red sub-pixel, the blue sub-pixel and the green sub-pixel. The particular execution of the step S102 includes, firstly, adjusting the display panel that is originally in the initial state to a first state (the first state refers to the state in which the brightness of the display panel attenuates to the target brightness); in the state in which the brightness of the display panel is the target brightness, controlling the second-color sub-pixel of the display panel to emit light. And subsequently, testing the capacitance-voltage relation of the second-color sub-pixel in the state in which the brightness of the display panel is the target brightness, and according to the capacitance-voltage relation of the second-color sub-pixel, obtaining the first capacitance of the second-color sub-pixel. The capacitance-voltage relation of the second-color sub-pixel may refer to a capacitance-voltage curve of the second-color sub-pixel, which is used to characterize a diagram of a curve of the capacitance-value variation of the second-color sub-pixel in the state of the target brightness under different voltages. The first capacitance may refer to the capacitance of a single second-color sub-pixel under the target voltage when the brightness of the display panel attenuates to the target brightness, and may also refer to the capacitance of all of the second-color sub-pixels of the display panel under a target voltage when the brightness of the display panel attenuates to the target brightness. Preferably, the first capacitance refers to the maximum capacitance of all of the second-color sub-pixels of the display panel under various voltages when the brightness of the display panel attenuates to the target brightness.

In an embodiment of the present application, when the brightness of the display panel is the target brightness, in the process during which the second-color sub-pixel of the display panel is applied the target voltage, the holes generated by the anode pass through the first charge-carrier layer and move toward the luminescent layer of the second-color sub-pixel, during which process the holes might be distributed at the interfaces of one or more of the layer components of the first charge-carrier layer, and the electrons generated by the cathode pass through the second charge-carrier layer and move toward the luminescent layer of the first-color sub-pixel, during which process the electrons might be distributed at the interfaces of one or more of the layer components of the second charge-carrier layer. Therefore, when the target voltage is reached, the holes and the electrons are concentrated at the interfaces between different layers, wherein the layer interface where the electrons are distributed and the layer interface where the holes are distributed form a plurality of capacitors that are connected in parallel, and the plurality of capacitors under the target voltage are combined into the first capacitance of the second-color sub-pixel. Furthermore, based on the first capacitances under different target voltages, the capacitance-voltage curve of the second-color sub-pixel in the state of the target brightness is acquired.

S103: comparing the initial capacitance and the first capacitance of the sub-pixel, to obtain a capacitance-variation value of the sub-pixel.

The particular execution of the step S103 includes, based on the differences between the initial capacitance and the first capacitance of the sub-pixels (including the first-color sub-pixel and the second-color sub-pixel), acquiring the capacitance-variation values corresponding to the sub-pixels. The capacitance-variation value is used to measure the capacitance state of the sub-pixel after the brightness attenuation in the display panel. The capacitance-variation value may refer to the difference between the initial capacitance and the first capacitance of the sub-pixel, and may also refer to the ratio of the initial capacitance to the first capacitance of the sub-pixel. The particular capacitance-variation value may be decided according to practical situations, and is not limited in the present disclosure. As an example, for the RGB sub-pixels of the display panel, the capacitance-variation value of each of the sub-pixels is acquired by using the following process, which includes: using the red sub-pixel, the green sub-pixel and the blue sub-pixel individually as the first-color sub-pixel, to acquire the initial capacitance $C_{R\text{-}0}$ of the red sub-pixel, the initial capacitance $C_{G\text{-}0}$ of the green sub-pixel and the initial capacitance $C_{B\text{-}0}$ of the blue sub-pixel; using the red sub-pixel, the green sub-pixel and the blue sub-pixel individually as the second-color sub-pixel, to acquire the first capacitance $C_{R\text{-}1}$ of the red sub-pixel, the first capacitance $C_{G\text{-}1}$ of the green sub-pixel and the first capacitance $C_{B\text{-}1}$ of the blue sub-pixel; and calculating the ratio of the initial capacitance to the first capacitance of the sub-pixel, to obtain the capacitance-variation value of the sub-pixel, wherein the capacitance-variation values of the sub-pixels are acquired by using the following formulas:

$$R_R = C_{R-0}/C_{R-1};$$

$$R_G = C_{G-0}/C_{G-1}; \text{ and}$$

$$R_B = C_{B-0}/C_{B-1};$$

wherein $R_R$ is the capacitance-variation value of the red sub-pixel; $R_G$ is the capacitance-variation value of the green sub-pixel; $R_B$ is the capacitance-variation value of the blue sub-pixel; $C_{R-0}$ is the initial capacitance of the red sub-pixel; $C_{R-1}$ is the first capacitance of the red sub-pixel; $C_{G-0}$ is the initial capacitance of the green sub-pixel; $C_{G-1}$ is the first capacitance of the green sub-pixel; $C_{B-0}$ is the initial capacitance of the blue sub-pixel; and $C_{B-1}$ is the first capacitance of the blue sub-pixel.

S104: calculating a ratio of the capacitance-variation values of two sub-pixels having different colors.

In the particular execution of the step S104, after the capacitance-variation values of the plurality of sub-pixels having different luminescent colors are acquired, the capacitance-variation value of each type of the sub-pixels characterizes the capacitance state of the sub-pixel after the brightness attenuation. If the capacitance states of the sub-pixels having different luminescent colors when they attenuate to the same target brightness have a low difference, that indicates that the capacitance-variation values of the sub-pixels having different luminescent colors of the display panel are in a relative equilibrium state.

Particularly, the ratio of the capacitance-variation values of two sub-pixels having different colors is calculated, and the ratio is used to characterize the difference between the amplitudes of the variation of the capacitance states of the sub-pixels having different luminescent colors when they attenuate to the same target brightness. As an example, the display panel includes a red sub-pixel, a green sub-pixel and a blue sub-pixel, and, after the capacitance-variation value $R_R$ of the red sub-pixel, the capacitance-variation value $R_G$ of the green sub-pixel and the capacitance-variation value $R_B$ of blue sub-pixel are obtained by using the above steps, the ratio $R_R/R_B$ of the capacitance-variation values of the red sub-pixel and the blue sub-pixel, the ratio $R_R/R_G$ of the capacitance-variation values of the red sub-pixel and the green sub-pixel and the ratio $R_B/R_G$ of the capacitance-variation values of the blue sub-pixel and the green sub-pixel are calculated individually.

S105: if the ratio is greater than or equal to a first threshold, and less than or equal to a second threshold, determining that the display panel is tested to be qualified.

The particular execution of the step S105 includes: determining whether the ratio of the capacitance-variation values of the two sub-pixels having different luminescent colors is in the range between the first threshold and the second threshold; if the ratio of the capacitance-variation values is less than the first threshold or greater than the second threshold, which indicates that the amplitudes of the variation of the capacitance states of the sub-pixels having different luminescent colors when the brightness of the display panel attenuates have a high difference, and the display panel might have problems of inaccurate color displaying such as chromatic aberration in operation, determining the display panel to be unqualified in the test; and if the ratio of the capacitance-variation values is greater than or equal to the first threshold and less than or equal to the second threshold, which indicates that the amplitudes of the variation of the capacitance states of the sub-pixels having different luminescent colors when the brightness of the display panel attenuates have a low difference, and the display panel has accurate color displaying in operation, determining the display panel to be qualified in the test. As an example, the display panel includes a red sub-pixel, a green sub-pixel and a blue sub-pixel, the first threshold is 0.8, the second threshold is 1.25, and the ratios of the capacitance-variation values of the two sub-pixels having different luminescent colors are judged by using the following formulas:

$$0.8 \le R_R/R_B \le 1.25;$$

$$0.8 \le R_R/R_G \le 1.25; \text{ and}$$

$$0.8 \le R_B/R_G \le 1.25;$$

wherein $R_R$ is the capacitance-variation value of the red sub-pixel, $R_G$ is the capacitance-variation value of the green sub-pixel, and $R_B$ is the capacitance-variation value of the blue sub-pixel.

In an alternative embodiment, if the display panel is determined to be unqualified in the test, based on the ratio of the capacitance-variation values that is not in the range between the first threshold and the second threshold, the problematic sub-pixel is determined, the composition of the layer-component materials of the problematic sub-pixel is replaced from the above-described ranges of the layer-component materials, and the steps S101-S105 are repeated, till the display panel is determined to be qualified in the test.

In order to enable a person skilled in the art to more clearly comprehend the present disclosure, the testing method of a display panel according to the present disclosure will be described in detail with reference to the following embodiments.

The process includes acquiring the display panel in a Comparative Example; firstly, adjusting the display panel to the initial state; in the state in which the brightness of the display panel is the initial brightness, controlling individually the red sub-pixel, the green sub-pixel and the blue sub-pixel of the display panel to emit light, and testing the capacitance-voltage curve of the red sub-pixel, the capacitance-voltage curve of the green sub-pixel and the capacitance-voltage curve of the blue sub-pixel in the state in which the brightness of the display panel is the initial brightness; and causing the brightness of the display panel to attenuate to the target brightness (90% of the initial brightness), and testing the capacitance-voltage curve of the red sub-pixel, the capacitance-voltage curve of the green sub-pixel and the capacitance-voltage curve of the blue sub-pixel in the state in which the brightness of the display panel is the target brightness.

Figure 2:
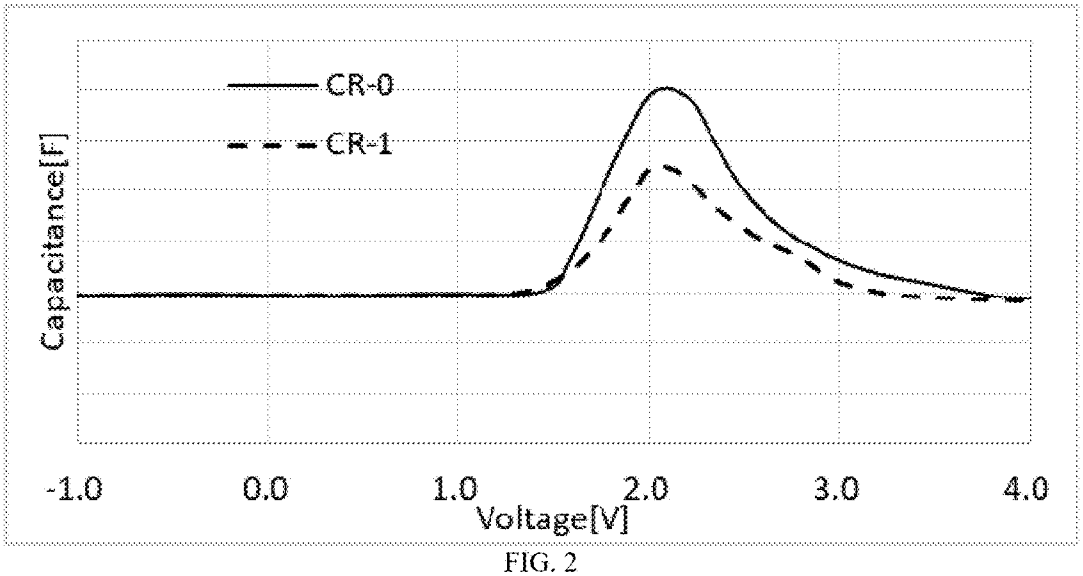
FIG. 2 schematically shows a diagram of a curve of the capacitance-voltage relation of the red sub-pixel of the display panel in a Comparative Example.

FIG. 2 schematically shows a diagram of a curve of the capacitance-voltage relation of the red sub-pixel of the display panel in a Comparative Example. As shown in FIG. 2, the solid line is the voltage-capacitance curve of the red sub-pixel at the initial brightness, and the dotted line is the voltage-capacitance curve of the red sub-pixel at the target brightness. By using the maximum capacitance (the peak value of the solid line in FIG. 2) of the voltage-capacitance curve of the red sub-pixel at the initial brightness as the initial capacitance $C_{R-0}$ of the red sub-pixel, and using the maximum capacitance (the peak value of the dotted line in FIG. 2) of the voltage-capacitance curve of the red sub-pixel at the target brightness as the first capacitance $C_{R-1}$ of the red sub-pixel, the ratio of the initial capacitance to the first capacitance of the red sub-pixel is calculated, to obtain the pixel variation value $R_R$ of the red sub-pixel, wherein $R_R=C_{R-0}/C_{R-1}$.

Figure 3:
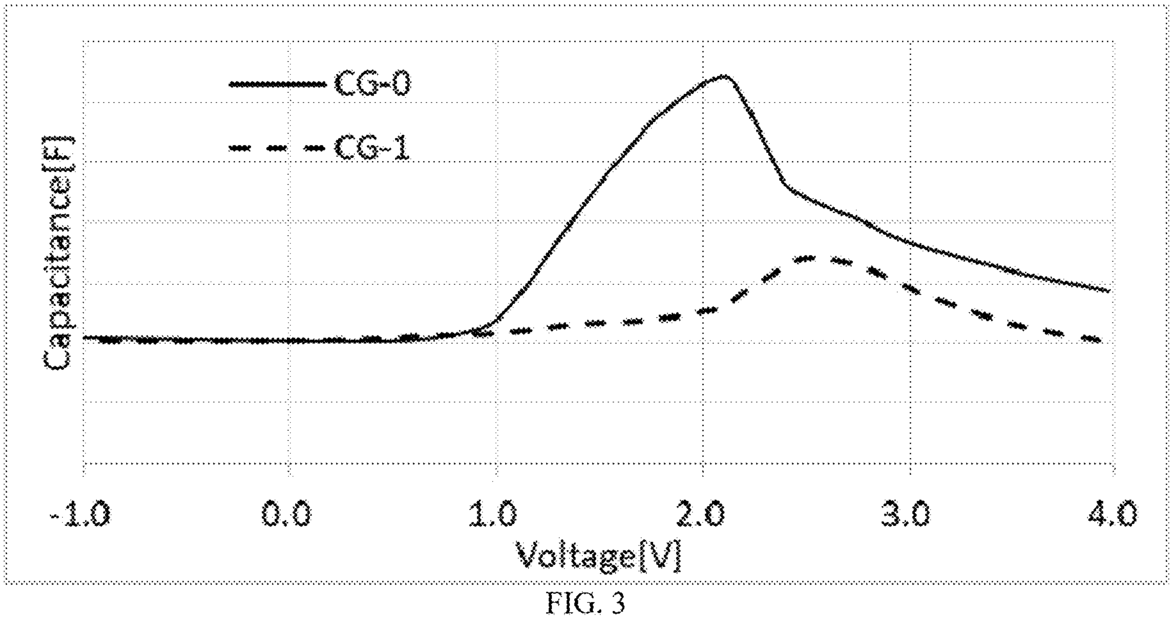
FIG. 3 schematically shows a diagram of a curve of the capacitance-voltage relation of the green sub-pixel of the display panel in a Comparative Example.

FIG. 3 schematically shows a diagram of a curve of the capacitance-voltage relation of the green sub-pixel of the display panel in a Comparative Example. As shown in FIG. 3, the solid line is the voltage-capacitance curve of the green sub-pixel at the initial brightness, and the dotted line is the voltage-capacitance curve of the green sub-pixel at the target brightness. By using the maximum capacitance (the peak value of the solid line in FIG. 3) of the voltage-capacitance curve of the green sub-pixel at the initial brightness as the initial capacitance $C_{G\text{-}0}$ of the green sub-pixel, and using the maximum capacitance (the peak value of the dotted line in FIG. 3) of the voltage-capacitance curve of the green sub-pixel at the target brightness as the first capacitance $C_{G\text{-}1}$ of the green sub-pixel, the ratio of the initial capacitance to the first capacitance of the green sub-pixel is calculated, to obtain the pixel variation value $R_G$ of the green sub-pixel, wherein $R_G=C_{G\text{-}0}/C_{G\text{-}1}$.

Figure 4:
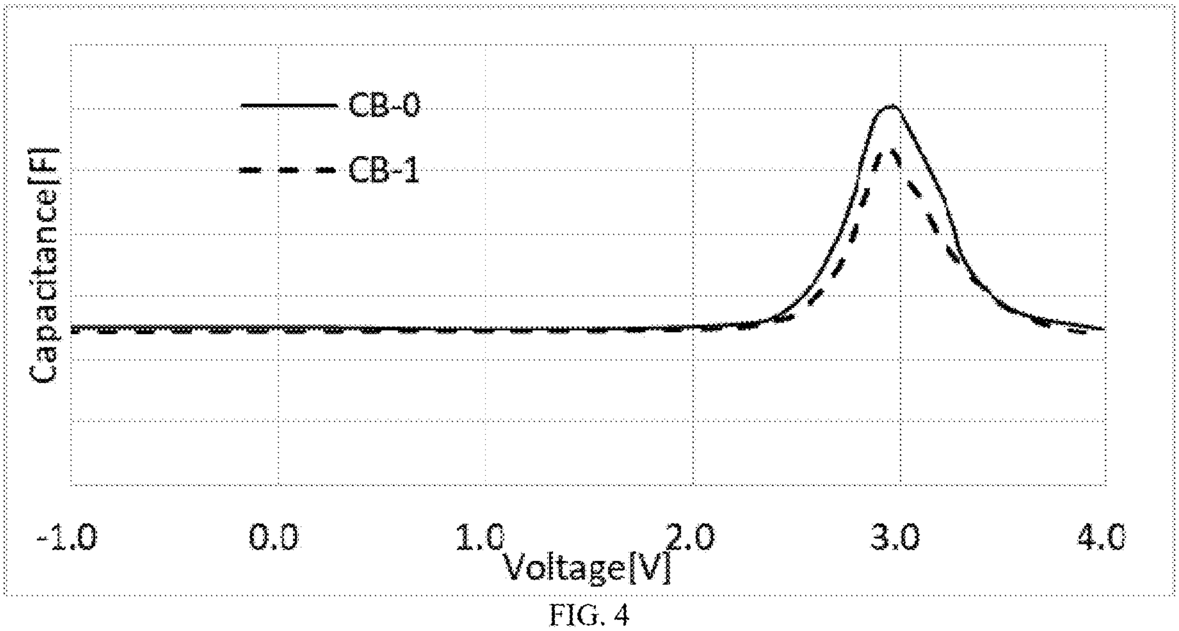
FIG. 4 schematically shows a diagram of a curve of the capacitance-voltage relation of the blue sub-pixel of the display panel in a Comparative Example.

FIG. 4 schematically shows a diagram of a curve of the capacitance-voltage relation of the blue sub-pixel of the display panel in a Comparative Example. As shown in FIG. 4, the solid line is the voltage-capacitance curve of the blue sub-pixel at the initial brightness, and the dotted line is the voltage-capacitance curve of the blue sub-pixel at the target brightness. By using the maximum capacitance (the peak value of the solid line in FIG. 4) of the voltage-capacitance curve of the blue sub-pixel at the initial brightness as the initial capacitance $C_{B\text{-}0}$ of the blue sub-pixel, and using the maximum capacitance (the peak value of the dotted line in FIG. 4) of the voltage-capacitance curve of the blue sub-pixel at the target brightness as the first capacitance $C_{B\text{-}1}$ of the blue sub-pixel, the ratio of the initial capacitance to the first capacitance of the blue sub-pixel is calculated, to obtain the pixel variation value $R_B$ of the blue sub-pixel, wherein $R_B=C_{B\text{-}0}/C_{B\text{-}1}$.

Table 1 shows the pixel variation values of the sub-pixels of the display panel of the Comparative Example. As shown in Table 1, in the display panel of the Comparative Example, the pixel variation value $R_R$ of the red sub-pixel is 1.28, the pixel variation value $R_G$ of the green sub-pixel is 1.88, and the pixel variation value $R_B$ of the blue sub-pixel is 1.11.

TABLE 1

The pixel variation values of the sub-pixels of the display panel of the Comparative Example

| Pixel variation value | Calculation result |
|---|---|
| $R_R$ | 1.28 |
| $R_G$ | 1.88 |
| $R_B$ | 1.11 |

After the capacitance-variation values of the red sub-pixel, the green sub-pixel and the blue sub-pixel have been acquired, the ratio $R_R/R_B$ of the capacitance-variation values of the red sub-pixel and the blue sub-pixel, the ratio $R_R/R_G$ of the capacitance-variation values of the red sub-pixel and the green sub-pixel and the ratio $R_B/R_G$ of the capacitance-variation values of the blue sub-pixel and the green sub-pixel are calculated individually. Table 2 shows the ratios of the pixel variation values of two sub-pixels having different luminescent colors of the display panel of the Comparative Example. As shown in Table 2, the ratio $R_R/R_B$ of the pixel variation values of the red sub-pixel and the blue sub-pixel is 1.15, the ratio $R_R/R_G$ of the pixel variation values of the red sub-pixel and the green sub-pixel is 0.68, and the ratio $R_B/R_G$ of the pixel variation values of the blue sub-pixel and the green sub-pixel is 0.59.

TABLE 2

The ratios of the pixel variation values of two sub-pixels having different luminescent colors of the display panel of the Comparative Example

| Ratio of pixel variation values | Calculation result |
|---|---|
| $R_R/R_B$ | 1.15 |
| $R_R/R_G$ | 0.68 |
| $R_B/R_G$ | 0.59 |

By setting that the first threshold is 0.8, and the second threshold is 1.25, according to the above ratios of the pixel variation values of two sub-pixels having different luminescent colors of the display panel of the Comparative Example, it can be known that, in the Comparative Example, the ratio $R_R/R_G$ of the pixel variation values of the red sub-pixel and the green sub-pixel and the ratio $R_B/R_G$ of the pixel variation values of the blue sub-pixel and the green sub-pixel are not in the range between the first threshold and the second threshold. That indicates that the amplitudes of the variation of the capacitance states of the sub-pixels having different luminescent colors when the brightness of the display panel attenuates have a high difference, and the display panel might have problems of inaccurate color displaying such as chromatic aberration in operation. In this case, it is determined that the display panel of the Comparative Example is unqualified in the test.

Based on the calculation result in Table 2, it can be known that the capacitance variation of the green sub-pixel included in the Comparative Example has a lower relative value, and it is determined that the state of the accumulation of the capacitors of the green sub-pixel of the display panel of the Comparative Example at the interfaces of the layer components in operation is highly different from those of the red sub-pixel and the blue sub-pixel, which causes that, in operation, the state of its capacitance variation has a high difference. Therefore, the layer-component materials employed by the green sub-pixel of the display panel of the Comparative Example are acquired, and the layer components of the green sub-pixel of the display panel of the Comparative Example are anode/HIL/HTL/EBL/GH:GD/HBL/ETL/EIL/cathode. Table 3 shows the chemical structures of some of the materials employed by the green sub-pixel of the display panel of the Comparative Example. As shown in Table 3:

TABLE 3

The chemical structures of some of the materials employed by the green sub-pixel of the display panel of the Comparative Example

| | |
|---|---|
| Hole-transportation-type P-type dopant (F4TCNQ) | 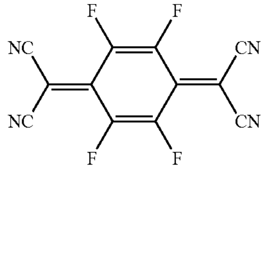 [SMILES: N#CC(C#N)=c1c(F)c(F)c(=C(C#N)C#N)c(F)c1F] |

TABLE 3-continued
| The chemical structures of some of the materials employed by the green sub-pixel of the display panel of the Comparative Example | |
|---|---|
| Hole transporting material HTL | 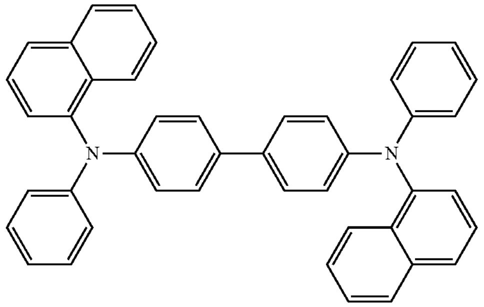 [SMILES: c1ccc(N(c2ccc(-c3ccc(N(c4ccccc4)c4cccc5ccccc45)cc3)cc2)c2cccc3ccccc23)cc1] |
| Electron blocking material EBL | 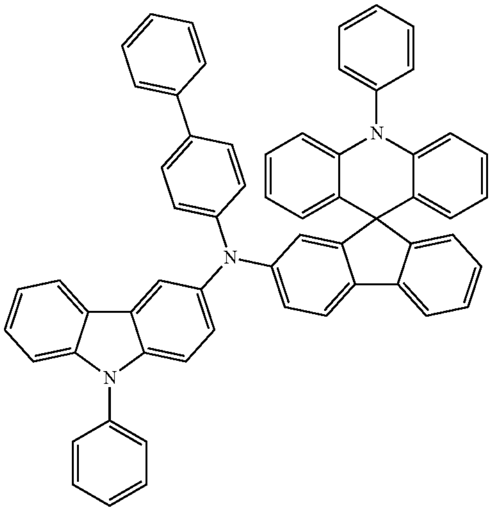 [SMILES: c1ccc(-c2ccc(N(c3ccc4c(c3)C3(c5ccccc5-4)c4ccccc4N(c4ccccc4)c4ccccc43)c3ccc4c(c3)c3ccccc3n4-c3ccccc3)cc2)cc1] |
| Hole blocking material HBL (TPBi) | 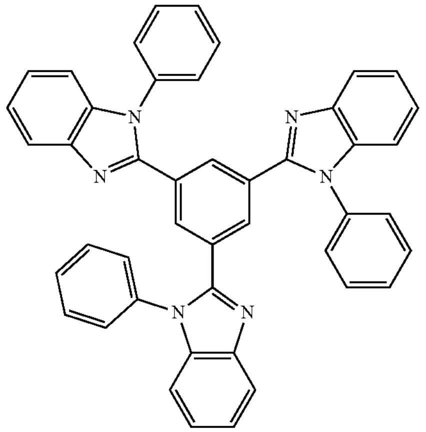 [SMILES: c1ccc(-n2c(-c3cc(-c4nc5ccccc5n4-c4ccccc4)cc(-c4nc5ccccc5n4-c4ccccc4)c3)nc3ccccc32)cc1] |
| Electron transporting material ETL (BCP) | 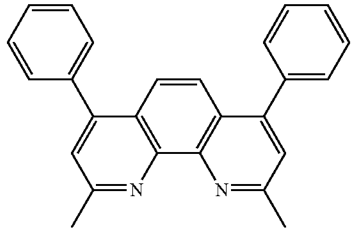 [SMILES: Cc1cc(-c2ccccc2)c2ccc3c(-c4ccccc4)cc(C)nc3c2n1] |

TABLE 3-continued

| The chemical structures of some of the materials employed by the green sub-pixel of the display panel of the Comparative Example | |
|---|---|
| Electron-transportation-type doping material (LiQ) | 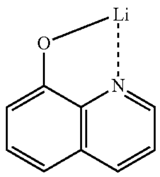 |
| Green luminescent host material GH | 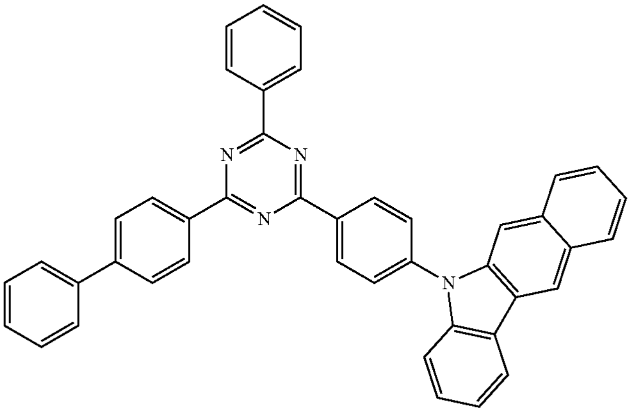 [SMILES: c1ccc(-c2ccc(-c3nc(-c4ccccc4)nc(-c4ccc(-n5c6ccccc6c6cc7ccccc7cc65)cc4)n3)cc2)cc1] |
| Green luminescent guest material GD | 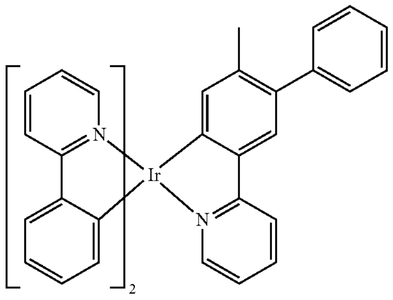 |

By replacing the green luminescent host material, the hole transporting material and the electron blocking material of the green sub-pixel of the display panel of the Comparative Example in the range of the layer-component materials according to the embodiments of the present disclosure, the display panel according to Example 1 is obtained. The layer components of the green sub-pixel of the display panel according to Example 1 are anode/HIL/HTL/EBL-1/EBL-2/GH-1:GH-2:GD/HBL/ETL/EIL/cathode. Table 4 shows the chemical structures of some of the materials employed by the green sub-pixel of the display panel according to Example 1. As shown in Table 4:

TABLE 4

| The chemical structures of some of the materials employed by the green sub-pixel of the display panel according to Example 1 | |
|---|---|
| Hole-transportation-type P-type dopant (F4TCNQ) | 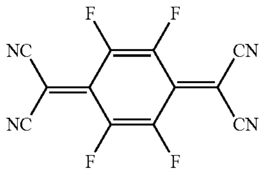 [SMILES: N#CC(C#N)=c1c(F)c(F)c(=C(C#N)C#N)c(F)c1F] |

TABLE 4-continued
| The chemical structures of some of the materials employed by the green sub-pixel of the display panel according to Example 1 | |
|---|---|
| Hole transporting material HTL | 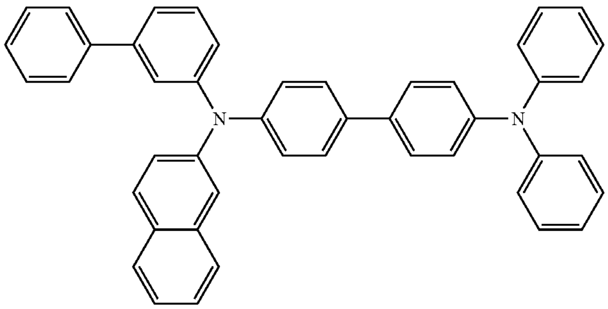 [SMILES: c1ccc(-c2cccc(N(c3ccc(-c4ccc(N(c5ccccc5)c5ccccc5)cc4)cc3)c3ccc4ccccc4c3)c2)cc1] |
| Electron blocking material EBL-1 | 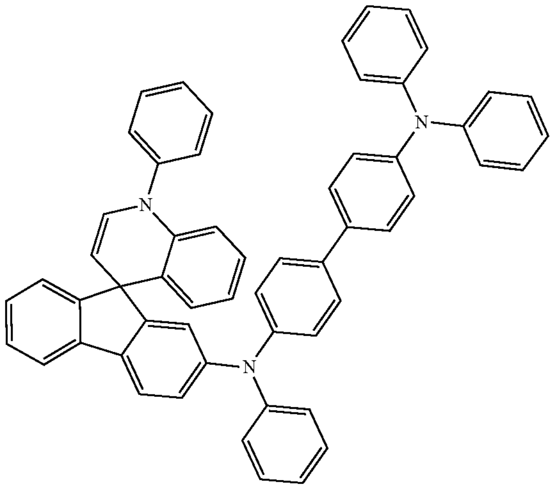 [SMILES: C1=CC2(c3ccccc3-c3ccc(N(c4ccccc4)c4ccc(-c5ccc(N(c6ccccc6)c6ccccc6)cc5)cc4)cc32)c2ccccc2N1c1ccccc1] |
| Electron blocking material EBL-2 | 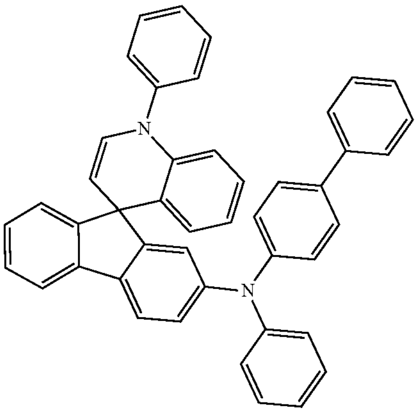 [SMILES: C1=CC2(c3ccccc3-c3ccc(N(c4ccccc4)c4ccc(-c5ccccc5)cc4)cc32)c2ccccc2N1c1ccccc1] |

TABLE 4-continued
| The chemical structures of some of the materials employed by the green sub-pixel of the display panel according to Example 1 | |
|---|---|
| Hole blocking material HBL (TPBi) | 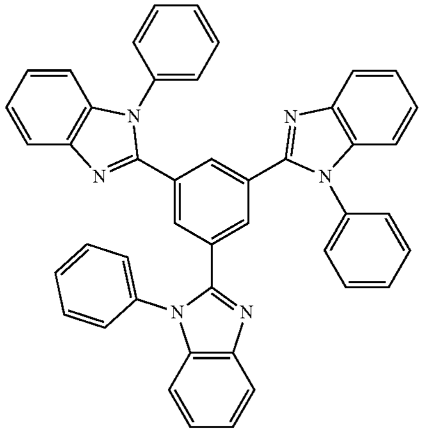 [SMILES: c1ccc(-n2c(-c3cc(-c4nc5ccccc5n4-c4ccccc4)cc(-c4nc5ccccc5n4-c4ccccc4)c3)nc3ccccc32)cc1] |
| Electron transporting material ETL (BCP) | 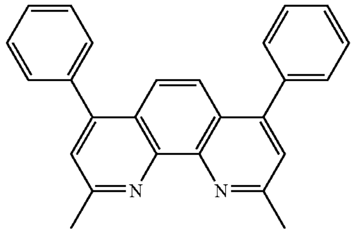 [SMILES: Cc1cc(-c2ccccc2)c2ccc3c(-c4ccccc4)cc(C)nc3c2n1] |
| Electron-transportation-type doping material (LiQ) | 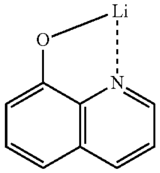 |
| Green luminescent host material GH-1 | 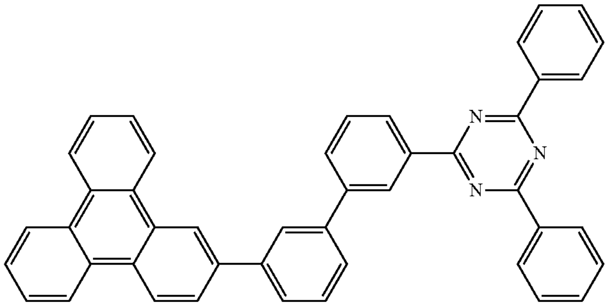 [SMILES: c1ccc(-c2nc(-c3ccccc3)nc(-c3cccc(-c4cccc(-c5ccc6c7ccccc7c7ccccc7c6c5)c4)c3)n2)cc1] |
| green luminescent host material GH-2 | 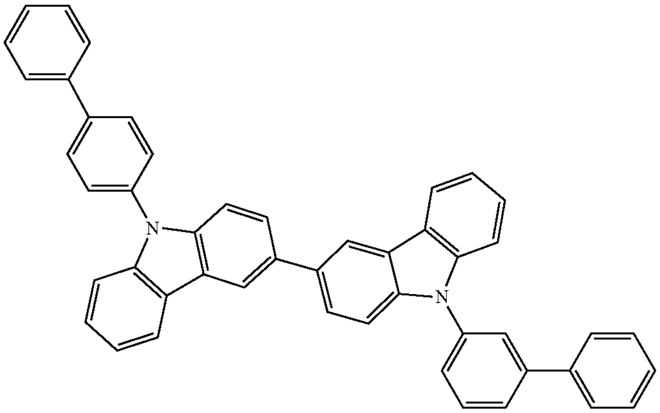 [SMILES: c1ccc(-c2ccc(-n3c4ccccc4c4cc(-c5ccc6c(c5)c5ccccc5n6-c5cccc(-c6ccccc6)c5)ccc43)cc2)cc1] |

TABLE 4-continued

| The chemical structures of some of the materials employed by the green sub-pixel of the display panel according to Example 1 | |
|---|---|
| Green luminescent guest material GD | 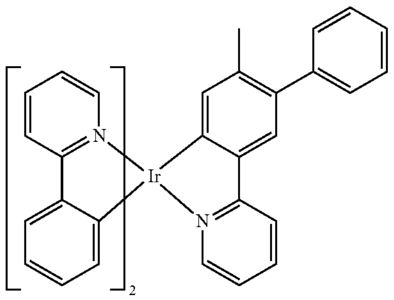 |

The process includes acquiring the display panel according to Example 1; adjusting it to the initial state; in the state in which the brightness of the display panel is the initial brightness, controlling individually the red sub-pixel, the green sub-pixel and the blue sub-pixel of the display panel to emit light, and testing the capacitance-voltage curve of the red sub-pixel, the capacitance-voltage curve of the green sub-pixel and the capacitance-voltage curve of the blue sub-pixel in the state in which the brightness of the display panel is the initial brightness; and causing the brightness of the display panel to attenuate to the target brightness (90% of the initial brightness), and testing the capacitance-voltage curve of the red sub-pixel, the capacitance-voltage curve of the green sub-pixel and the capacitance-voltage curve of the blue sub-pixel in the state in which the brightness of the display panel is the target brightness.

Figure 5:
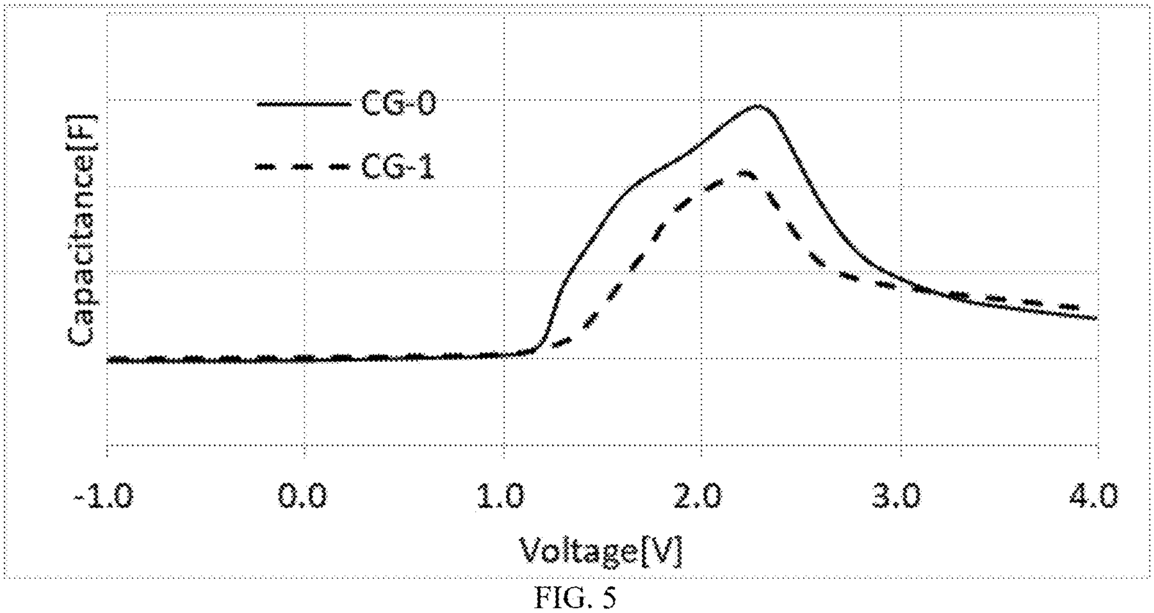
FIG. 5 schematically shows a diagram of a curve of the capacitance-voltage relation of the green sub-pixel of the display panel according to Example 1 of the present disclosure.

Taking the green sub-pixel whose layer-component materials are replaced as an example, FIG. 5 schematically shows a diagram of a curve of the capacitance-voltage relation of the green sub-pixel of the display panel according to Example 1 of the present disclosure. As shown in FIG. 5, the solid line is the voltage-capacitance curve of the green sub-pixel at the initial brightness, and the dotted line is the voltage-capacitance curve of the green sub-pixel at the target brightness. By using the maximum capacitance (the peak value of the solid line in FIG. 5) of the voltage-capacitance curve of the green sub-pixel at the initial brightness as the initial capacitance $C_{G\text{-}0}$ of the green sub-pixel, and using the maximum capacitance (the peak value of the dotted line in FIG. 5) of the voltage-capacitance curve of the green sub-pixel at the target brightness as the first capacitance $C_{G\text{-}1}$ of the green sub-pixel, the ratio of the initial capacitance to the first capacitance of the green sub-pixel is calculated, to obtain the pixel variation value $R_R$ of the green sub-pixel of the display panel according to Example 1, wherein $R_R=C_{R\text{-}0}/C_{R\text{-}1}$.

Table 5 shows the pixel variation values of the sub-pixels of the display panel according to Example 1. As shown in Table 5, in the display panel of the Comparative Example, the pixel variation value $R_R$ of the red sub-pixel is 1.28, the pixel variation value $R_B$ of the blue sub-pixel is 1.11, and the pixel variation value $R_G$ of the green sub-pixel, because of the replacement of the layer-component materials, changes into 1.25.

TABLE 5

The pixel variation values of the sub-pixels of the display panel according to Example 1

| Pixel variation value | Calculation result |
|---|---|
| $R_R$ | 1.28 |
| $R_G$ | 1.25 |
| $R_B$ | 1.11 |

After the capacitance-variation values of the red sub-pixel, the green sub-pixel and the blue sub-pixel are acquired, the ratio $R_R/R_B$ of the capacitance-variation values of the red sub-pixel and the blue sub-pixel, the ratio $R_R/R_G$ of the capacitance-variation values of the red sub-pixel and the green sub-pixel and the ratio $R_B/R_G$ of the capacitance-variation values of the blue sub-pixel and the green sub-pixel are calculated individually. Table 6 shows the ratios of the pixel variation values of two sub-pixels having different luminescent colors of the display panel according to Example 1. As shown in Table 6, the ratio $R_R/R_B$ of the pixel variation values of the red sub-pixel and the blue sub-pixel is 1.15, the ratio $R_R/R_G$ of the pixel variation values of the red sub-pixel and the green sub-pixel is 1.03, and the ratio $R_B/R_G$ of the pixel variation values of the blue sub-pixel and the green sub-pixel is 0.89.

TABLE 6

The ratios of the pixel variation values of two sub-pixels having different luminescent colors of the display panel according to Example 1

| Ratio of pixel variation values | Calculation result |
|---|---|
| $R_R/R_B$ | 1.15 |
| $R_R/R_G$ | 1.03 |
| $R_B/R_G$ | 0.89 |

By setting that the first threshold is 0.8, and the second threshold is 1.25, according to the above ratios of the pixel variation values of two sub-pixels having different luminescent colors of the display panel according to Example 1, it can be known that, by replacing the layer-component materials of the green sub-pixel, all of the ratio $R_R/R_B$ of the capacitance-variation values of the red sub-pixel and the blue sub-pixel, the ratio $R_R/R_G$ of the pixel variation values of the red sub-pixel and the green sub-pixel and the ratio $R_B/R_G$ of the pixel variation values of the blue sub-pixel and the green sub-pixel according to Example 1 are in the range between the first threshold and the second threshold. That indicates that the differences of the amplitudes of the variation of the capacitance states of the sub-pixels having different luminescent colors when the brightness of the display panel attenuates tend to be equal, and the display panel according to Example 1 do not have problems of inaccurate color displaying in operation. In this case, it is determined that the display panel according to Example 1 is qualified in the test.

Table 7 shows the data of the energy-level simulation on the materials of the electron blocking layers in the Comparative Example and Example 1. The HOMO energy levels and the LUMO energy levels in Table 7 are calculated by simulating, and have constant gaps from the measured values, wherein the constant gaps are approximately −0.55 eV to −0.6 eV. As shown in Table 7, the simulated HOMO energy level of the materials of the electron blocking layer of the Comparative Example is-4.6 eV, and therefore the experimental test value corresponding to the materials of the electron blocking layer of the Comparative Example is approximately −5.15 eV to −5.2 eV, wherein the HOMO energy level is in the selectable energy-level range of −5.8 eV to −5.0 eV of the electron blocking material according to the embodiments of the present disclosure. When it is determined that the layer-component materials of the green sub-pixel of the Comparative Example are required to be replaced, the simulated HOMO energy level of the materials of the electron blocking layer EBL-1 that are replaced according to Example 1 is −4.68 eV, and the corresponding experimental test value is approximately −5.23 eV to −5.28 eV. The simulated HOMO energy level of the materials of the electron blocking layer EBL-2 that are replaced according to Example 1 is-4.79 eV, and the corresponding experimental test value is approximately −5.34 eV to −5.38 eV. The materials EBL-1 and EBL-2 of the electron blocking layer are also the materials that satisfy the selectable energy-level range of −5.8 eV to −5.0 eV of the electron blocking material according to the embodiments of the present disclosure. Example 1, in which the layer-component materials are replaced, is determined to be qualified in the test.

TABLE 7

The data of the energy-level simulation on the materials of the electron blocking layers in the Comparative Example and Example 1

| | HOMO energy level (eV) | LUMO energy level (eV) | Reorganization energy ROE |
|---|---|---|---|
| Comparative Example (EBL) | −4.6 | −0.9 | 0.14 |
| Example 1 (EBL-1) | −4.68 | −0.95 | 0.22 |
| Example 1 (EBL-2) | −4.79 | −0.92 | 0.12 |

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A display panel, wherein the display panel comprises:

a substrate, and a plurality of sub-pixels located on one side of the substrate; and a ratio of capacitance-variation values of two sub-pixels having different luminescent colors is greater than or equal to a first threshold, and less than or equal to a second threshold, wherein the first threshold is less than or equal to 1, and the second threshold is greater than or equal to 1, wherein the capacitance-variation values are used to characterize a difference between an initial capacitance and a first capacitance of a sub-pixel, the initial capacitance refers to a capacitance of the sub-pixel when a brightness of the display panel is an initial brightness, and the first capacitance refers to a capacitance of the sub-pixel when the brightness of the display panel attenuates to a target brightness.

2. The display panel according to claim 1, wherein a brightness ratio of the target brightness and the initial brightness is greater than or equal to 50%, and less than or equal to 90%.

3. The display panel according to claim 1, wherein the first threshold is greater than or equal to 0.7, and less than or equal to 1; and the second threshold is greater than or equal to 1, and less than or equal to 1.3.

4. The display panel according to claim 1, wherein each of the sub-pixels comprises:

a first electrode, a luminescent layer and a second electrode that are arranged sequentially in stack on one side of the substrate; and a first charge-carrier layer and a second charge-carrier layer, wherein the first charge-carrier layer is provided between the first electrode and the luminescent layer, and the second charge-carrier layer is provided between the second electrode and the luminescent layer.

5. The display panel according to claim 4, wherein when the first electrode is an anode, and the second electrode is a cathode, the first charge-carrier layer comprises:

at least one of a hole injection layer, a hole transporting layer and an electron blocking layer, wherein the hole injection layer, the hole transporting layer and the electron blocking layer are arranged sequentially in stack in a first direction between the anode and the luminescent layer, wherein the first direction refers to a direction from the anode pointing to the cathode; and the second charge-carrier layer comprises:

at least one of a hole blocking layer, an electron transporting layer and an electron injection layer, wherein the hole blocking layer, the electron transporting layer and the electron injection layer are arranged sequentially in stack in the first direction between the luminescent layer and the cathode.

6. The display panel according to claim 5, wherein a HOMO energy level of the hole transporting layer is greater than or equal to −5.8 eV, and less than or equal to −5.0 eV.

7. The display panel according to claim 5, wherein a HOMO energy level of the electron blocking layer is greater than or equal to −5.8 eV, and less than or equal to −5.0 eV.

8. The display panel according to claim 5, wherein a LUMO energy level of the hole blocking layer is greater than or equal to −3.5 eV, and less than or equal to −2.5 eV.

9. The display panel according to claim 5, wherein a LUMO energy level of the electron transporting layer is greater than or equal to −3.5 eV, and less than or equal to −2.5 eV.

10. The display panel according to claim 5, wherein a material of the electron injection layer comprises any one or more of a low-work-function-metal-type electron injection material and a metal-salt-type electron injection material.

11. The display panel according to claim 5, wherein a material of the hole injection layer comprises any one or more of a hole injection material and a P-type doping material, and the hole injection material comprises any one or more of copper phthalocyanine, 2,3,6,7,10,11-hexacyano-1,4,5,8,9,12-hexaazabenzophenanthrene and $MnO_3$.

12. The display panel according to claim 4, wherein the sub-pixels comprise at least a red sub-pixel, a green sub-pixel and a blue sub-pixel, a material of a luminescent layer of the red sub-pixel comprises a red luminescent material, a material of a luminescent layer of the green sub-pixel comprises a green luminescent material, and a material of a luminescent layer of the blue sub-pixel comprises a blue luminescent material;

the red luminescent material comprises any one or more of a DCM-series-type red luminescent material and a metal-complex-type red luminescent material;

the blue luminescent material comprises any one or more of a pyrene-derivative-type blue luminescent material, an anthracene-derivative-type blue luminescent material, a fluorene-derivative-type blue luminescent material, a perylene-derivative-type blue luminescent material, a styrylamine-derivative-type blue luminescent material and a metal-complex-type blue luminescent material; and the green luminescent material comprises any one or more of a coumarin-dye-type green luminescent material, a quinacridine-copper-derivative-type green luminescent material, a polycyclic-aromatic-hydrocarbon-type green luminescent material, a diaminoanthracene-type-derivative-type green luminescent material, a carbazole-derivative-type green luminescent material and a metal-complex-type green luminescent material.

13. The display panel according to claim 12, wherein the red luminescent material comprises any one or more of 4-(dicyanomethylene)-2-methyl-6-(4-dimethylaminostyryl)-4H-pyran, 4-(dicyanomethylene)-2-tert-butyl-6-(1,1,7,7-tetramethyljulolidin-9-alkenyl)-4H-pyran, di(1-phenylisoquinoline) (acetylacetone) iridium (III), octaethyl porphyrin platinum and di(2-(2'-benzothiophenyl)pyridine-N,C3') (acetylacetone) iridium.

14. The display panel according to claim 12, wherein the green luminescent material comprises any one or more of coumarin 6, coumarin 545T, quinacridine copper, N,N'-dimethylquinacridone, 5,12-diphenylnaphthonaphthalene, N10,N10'-diphenyl-N10,N10'-dibenzoyl-9,9'-dianthracene-10,10'-diamine, tri(8-hydroxyquinoline)aluminum (III), tri (2-phenylpyridine) iridium and acetopyruvic acid di(2-phenylpyridine) iridium.

15. The display panel according to claim 12, wherein the blue luminescent material comprises any one or more of N1,N6-di([1,1'-biphenyl]-2-yl)-N1,N6-di([1,1'-biphenyl]-4-yl) pyrene-1,6-diamine, 9,10-di-(2-naphthyl) anthracene, 2-methyl-9,10-di-2-naphthylanthracene, 2,5,8,11-tetra-tert-butylperylene, 4,4'-di[4-(diphenylamino) styryl]biphenyl, 4,4'-di[4-(di-p-methylphenylamido) styryl]biphenyl and di(4,6-difluorophenylpyridine-C2,N)pyridine formyl iridium.

16. A displaying device, wherein the displaying device comprises the display panel according to claim 1;

a driving circuit for supplying a driving signal to the display panel; and a power supply circuit for supplying a power signal to the display panel.

17. A testing method of a display panel, wherein the display panel comprises a substrate, and a plurality of sub-pixels located on one side of the substrate, and the testing method comprises a test:

in a state in which a brightness of the display panel is an initial brightness, acquiring an initial capacitance of a sub-pixel;

in a state in which the brightness of the display panel is a target brightness, acquiring a first capacitance of the sub-pixel;

comparing the initial capacitance and the first capacitance of the sub-pixel, to obtain a capacitance-variation value of the sub-pixel;

calculating a ratio of the capacitance-variation values of two sub-pixels having different colors; and if the ratio is greater than or equal to a first threshold, and less than or equal to a second threshold, determining that the display panel the test.

18. The testing method of the display panel according to claim 17, wherein the plurality of sub-pixels comprise a first-color sub-pixel, and the step of, in the state in which the brightness of the display panel is the initial brightness, acquiring the initial capacitance of the sub-pixel comprises:

in the state in which the brightness of the display panel is the initial brightness, controlling the first-color sub-pixel of the display panel to emit light;

testing a capacitance-voltage relation of the first-color sub-pixel; and according to the capacitance-voltage relation of the first-color sub-pixel, obtaining the initial capacitance of the first-color sub-pixel.

19. The testing method of the display panel according to claim 17, wherein the plurality of sub-pixels comprise a second-color sub-pixel, and the step of, in the state in which the brightness of the display panel is the target brightness, acquiring the first capacitance of the sub-pixel comprises:

in the state in which the brightness of the display panel is the target brightness, controlling the second-color sub-pixel of the display panel to emit light;

testing a capacitance-voltage relation of the second-color sub-pixel; and according to the capacitance-voltage relation of the second-color sub-pixel, obtaining the first capacitance of the second-color sub-pixel.

20. The testing method of the display panel according to claim 17, wherein the step of comparing the initial capacitance and the first capacitance of the sub-pixel, to obtain the capacitance-variation value of the sub-pixel comprises:

calculating a ratio of the initial capacitance to the first capacitance of the sub-pixel, to obtain the capacitance-variation value of the sub-pixel.

* * * * *